(12) United States Patent
Loh et al.

(10) Patent No.: US 10,319,451 B2
(45) Date of Patent: Jun. 11, 2019

(54) SEMICONDUCTOR DEVICE HAVING CHIP ID GENERATION CIRCUIT

(71) Applicant: Samsung Electronics Co., Ltd., Suwon-si (KR)

(72) Inventors: Yang-gyoon Loh, Hwaseong-si (KR); Je-min Ryu, Seoul (KR); Hyun-ki Kim, Yongin-si (KR); Yoon-jae Jeong, Anyang-si (KR)

(73) Assignee: SAMSUNG ELECTRONICS CO., LTD., Samsung-ro, Yeongton-gu, Suwon-si, Gyeonggi-do (KR)

( * ) Notice: Subject to any disclaimer, the term of this patent is extended or adjusted under 35 U.S.C. 154(b) by 164 days.

(21) Appl. No.: 15/232,586

(22) Filed: Aug. 9, 2016

(65) Prior Publication Data

US 2017/0125119 A1 May 4, 2017

(30) Foreign Application Priority Data

Oct. 29, 2015 (KR) ........................ 10-2015-0151101

(51) Int. Cl.
| | | |
|---|---|---|
| *G06F 11/00* | (2006.01) | |
| *G11C 17/18* | (2006.01) | |
| *G11C 17/16* | (2006.01) | |
| *G11C 29/12* | (2006.01) | |
| *G11C 29/00* | (2006.01) | |
| *G06F 11/16* | (2006.01) | |

(Continued)

(52) U.S. Cl.
CPC .............. *G11C 17/18* (2013.01); *G11C 17/16* (2013.01); *G11C 29/1201* (2013.01); *G11C 29/88* (2013.01); *G06F 11/16* (2013.01); *G11C 8/12* (2013.01); *G11C 2029/4402* (2013.01)

(58) Field of Classification Search
CPC ..... G11C 17/18; G11C 17/16; G11C 29/1201; G11C 29/88; G11C 8/12; G11C 2029/4402

See application file for complete search history.

(56) References Cited

U.S. PATENT DOCUMENTS

| | | | | |
|---|---|---|---|---|
| 5,592,632 A | * | 1/1997 | Leung ..................... | G06F 11/10 257/E21.526 |
| 7,149,135 B2 | * | 12/2006 | Okuno ................. | G11C 29/802 365/200 |

(Continued)

OTHER PUBLICATIONS

CAFC, Intellectual Ventures v. Capital One, pp. 1-18 (Year: 2017).*

*Primary Examiner* — Marc Duncan
*Assistant Examiner* — Jonathan D Gibson
(74) *Attorney, Agent, or Firm* — Muir Patent Law, PLLC

(57) ABSTRACT

Provided is a semiconductor device including chip identification (ID) generation circuits. The semiconductor device may be a multi-chip package including a plurality of memory chips, and each of the memory chips includes a chip ID generation circuit configured to selectively modify a chip ID of a corresponding memory chip. The chip ID generation circuit determines the chip ID of the memory chip by testing the chip ID of the memory chip by using a mode register, and selectively programs the chip ID of the memory chip by using at least two fuse sets. The chip ID generation circuit may block an output of the chip ID of the memory chip when the memory chip is determined as a defective chip or is selected to stop its use.

20 Claims, 13 Drawing Sheets

(51) Int. Cl.
*G11C 8/12* (2006.01)
*G11C 29/44* (2006.01)

(56) References Cited

U.S. PATENT DOCUMENTS

| | | | |
|---|---|---|---|
| 7,277,337 B1* | 10/2007 | Co | G11C 5/04 365/200 |
| 7,327,590 B2 | 2/2008 | Matsui et al. | |
| 7,535,772 B1 | 5/2009 | Parameswaran et al. | |
| 7,564,127 B2* | 7/2009 | Ikeda | G11C 5/02 257/686 |
| 7,698,470 B2* | 4/2010 | Ruckerbauer | G11C 5/02 326/38 |
| 7,753,496 B2 | 7/2010 | Ikeda et al. | |
| 8,233,303 B2* | 7/2012 | Best | G11C 5/02 365/51 |
| 8,473,653 B2* | 6/2013 | Kondo | G06F 1/12 710/29 |
| 9,047,929 B2 | 6/2015 | Seo et al. | |
| 9,177,940 B2* | 11/2015 | Lung | H01L 25/0657 |
| 2003/0145262 A1* | 7/2003 | Wheeler | G11C 17/16 714/718 |
| 2009/0039915 A1 | 2/2009 | Ruckerbauer et al. | |
| 2009/0040861 A1* | 2/2009 | Ruckerbauer | G11C 8/08 365/230.03 |
| 2009/0103345 A1* | 4/2009 | McLaren | G11C 5/02 365/64 |
| 2009/0132876 A1* | 5/2009 | Freking | G06F 11/106 714/723 |
| 2009/0231897 A1* | 9/2009 | Ryu | G11C 29/12005 365/51 |
| 2011/0050320 A1* | 3/2011 | Gillingham | G11C 5/02 327/365 |
| 2011/0292708 A1* | 12/2011 | Kang | H01L 23/481 365/63 |
| 2014/0233292 A1 | 8/2014 | Kang et al. | |
| 2014/0374923 A1* | 12/2014 | Park | H01L 25/0657 257/777 |
| 2015/0206825 A1 | 7/2015 | Park | |
| 2016/0301413 A1* | 10/2016 | Xiao | H03K 19/094 |
| 2017/0125119 A1* | 5/2017 | Loh | G11C 17/16 |

\* cited by examiner

SEMICONDUCTOR DEVICE HAVING CHIP ID GENERATION CIRCUIT

CROSS-REFERENCE TO RELATED APPLICATION

This application claims the benefit of Korean Patent Application No. 10-2015-0151101, filed on Oct. 29, 2015, in the Korean Intellectual Property Office, the disclosure of which is incorporated herein in its entirety by reference.

BACKGROUND

The exemplary implementations of the herein described subject matter relate to a semiconductor device, and more particularly, to a multi-chip package including a chip ID generation circuit that flexibly reassigns chip IDs of memory chips of a stack memory device.

Semiconductor devices are designed and manufactured for realizing high performance, high density, low cost, and a small size. Multi-chip package technology where a plurality of chips are integrated into a single package is being developed. The multi-chip package technology may be used in order for processors and memory chips, logic chips and memory chips, or memory chips to be integrated into a single package. If memory chips of the same type are integrated into a multi-chip package, each memory chip is designed to have a unique ID. After a multi-chip packaging process, if one of the memory chips becomes defective, the multi-chip package including the defective memory chip is treated as defective as a whole. Accordingly, memory chips included in the multi-chip package but not having any defects are also discarded, thereby decreasing semiconductor manufacturing yields and increasing manufacturing costs.

SUMMARY

The exemplary implementations provide a semiconductor device in which chip IDs of memory chips are flexibly reassigned so as to increase manufacturing yields and reduce costs.

The exemplary implementations also provide a multi-chip package in which chip IDs of channels are flexibly reassigned so as to increase manufacturing yields and reduce costs.

According to an aspect of the exemplary implementations, there is provided a semiconductor device including a plurality of chips, wherein each of the chips includes: a core area including a memory cell array; an interface area configured to provide an external interface; a chip ID generation circuit configured to selectively modify a chip ID of a core area of a corresponding chip; and a master/slave classification circuit configured to identify whether an interface area of the corresponding chip is a master chip or a slave chip.

The chip ID generation circuit may include: a chip ID fuse unit including at least two fuse sets that selectively program a chip ID of the chip; and a chip ID control circuit configured to output an output of a fuse set selected from among the at least two fuse sets, as a chip ID of the chip.

The at least two fuse sets may include an anti-fuse array including anti-fuses.

The chip ID generation circuit may be connected to a mode register that supports a test mode of the semiconductor device, and determine a chip ID of the chip by testing the chip ID of the chip.

The chip ID generation circuit may program the chip ID determined by using the mode register to one of the at least two fuse sets.

When the chip is determined as a defective chip, the chip ID generation circuit may block an output of the chip ID of the chip.

When the chip is selected to stop its use, the chip ID generation circuit may block an output of the chip ID of the chip.

The master/slave classification circuit may include: a chip state detection circuit connected to an external conductive terminal of the chip and configured to detect a bonding state of the external conductive terminal and output a detection signal; and a chip operation control circuit configured to control the chip to operate as the master chip or the slave chip in response to the detection signal.

The external conductive terminal of the chip may be connected to a power voltage or a ground voltage by bonding.

The semiconductor device may be a multi-chip package in which the plurality of chips are stacked, wherein the plurality of chips are electrically connected to one another via through electrodes.

According to another aspect of the exemplary implementations, there is provided a multi-chip package including a plurality of memory chips, the multi-chip package including: a memory buffer configured to perform an external interface function of the multi-chip package and perform a signal distribution function with respect to the memory chips; and the memory chips including channels that are stacked on the memory buffer, are electrically connected to one another via through electrodes, and provide interfaces that are independent of the memory buffer, wherein each of the memory chips includes a chip ID generation circuit that selectively modifies a chip ID of a corresponding channel.

The chip ID generation circuit may include: a chip ID fuse unit including at least two fuse sets that selectively program a chip ID of the corresponding channel; and a chip ID control circuit configured to output an output of a fuse set selected from among the at least two fuse sets, as a chip ID of the channel.

The chip ID generation circuit may be connected to a mode register that supports a test mode of the multi-chip package, and that determines the chip ID of the channel by testing the chip ID using the mode register.

The chip ID generation circuit may program the chip ID of the channel determined by using the mode register to one of the at least two fuse sets.

When the channel is determined as defective or is selected to stop its use, the chip ID generation circuit may block an output of the chip ID of the channel.

BRIEF DESCRIPTION OF THE DRAWINGS

Exemplary implementations of the herein described subject matter will be more clearly understood from the following detailed description taken in conjunction with the accompanying drawings in which.

Figure 1:
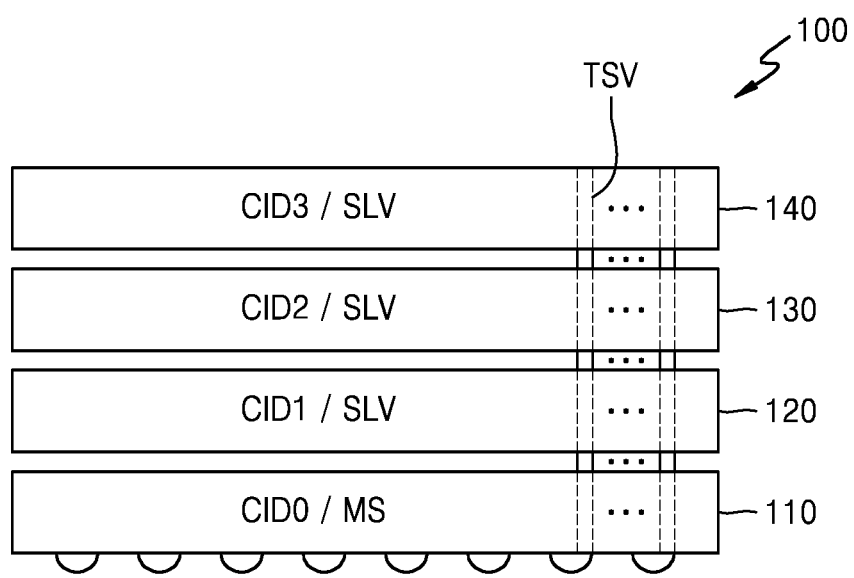
FIG. 1 illustrates a semiconductor device according to exemplary implementations.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

DETAILED DESCRIPTION

As used herein, the term "and/or" includes any and all combinations of one or more of the associated listed items. Expressions such as "at least one of" when preceding a list of elements, modify the entire list of elements and do not modify the individual elements of the list.

The accompanying drawings for illustrating exemplary implementations are referred to in order to gain a sufficient understanding of the inventive concept, the merits thereof, and the objectives accomplished by the exemplary implementations.

Hereinafter, example exemplary implementations will be described in detail with reference to the accompanying drawings. Since the exemplary implementations may have diverse modified embodiments, certain embodiments are illustrated in the drawings and are described in the detailed description of the exemplary implementations. However, this does not limit the inventive concept within specific exemplary implementations and it should be understood that the inventive concept covers all the modifications, equivalents, and replacements within the idea and technical scope of the inventive concept. Like reference numerals refer to like elements throughout. In the drawings, the dimensions and size of each structure are exaggerated, reduced, or schematically illustrated for convenience in description and clarity.

The terms used in the present specification are merely used to describe particular exemplary implementations, and are not intended to limit the exemplary implementations. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In semiconductor devices, a high-capacity dynamic random access memory (DRAM) may be implemented with a multi-chip package including a plurality of memory dies or memory layers. For example, each memory die or memory layer may correspond to a semiconductor chip. The multi-chip package may be a semiconductor package which is implemented as one package by stacking a plurality of semiconductor chips or various kinds of semiconductor chips.

The DRAM may further include a logic die which is electrically connected to a plurality of stacked memory dies. The logic die may receive a command, an address, a clock, and data from a memory controller and perform a signal distribution function of supplying the received command, address, clock, and data to the memory dies. The logic die may interface with the memory controller and buffer all of the command, the address, the clock, and the data, thereby operating as a memory buffer between the memory controller and the memory dies. The logic die may transmit or receive signals to or from the memory dies, for example, via a plurality of through substrate vias (TSVs), also referred to more specifically as through silicon vias, and generally as through electrodes.

FIG. 1 illustrates a semiconductor device 100 according to exemplary implementations.

As shown in FIG. 1, the semiconductor device 100 may be a multi-chip package in which first through fourth dies 110, 120, 130, and 140 are stacked. The first through fourth dies 110, 120, 130, and 140, each of which may be a semiconductor chip, may be electrically connected to one another using through substrate vias (TSVs), such as through silicon vias. The TSVs may be connected to electrode pads of adjacent dies among the first through fourth dies 110-140 and bumps that contact the electrode pads of the first through fourth dies 110-140.

As used herein, a semiconductor device may refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

The first through fourth dies 110-140 may be of the same type, and may be referred to as memory dies each having a core area including a memory cell array. For example, each die may be a particular type of volatile or nonvolatile memory, such as a DRAM, NAND, MRAM, or other type of memory. However, the first through fourth dies 110-140 are not limited to all being the same type. In one embodiment, the core area corresponds to the memory cell area of the memory die (e.g., including rows and columns or memory cells). The memory cell area may also be referred to as a memory cell array portion of the die or chip. The first through fourth dies 110-140 may each include an interface area in addition to the core area. The interface area may perform an interface function with respect to an external device of the semiconductor device 100. The interface area may also be referred to as an interface circuit portion of the die or chip. For example, the interface area may include circuits for controlling access to the core area (e.g., to a memory cell array of the die), which circuits include components such as column and row decoders, an I/O control circuit, etc. While four dies are stacked in the semiconductor device 100, the exemplary implementation is not limited thereto. According to an exemplary implementation, the first through fourth dies 110-140 may be of different types, for example, a processor and memory chips, a logic chip and memory chips, or a buffer chip and memory chips.

The first die 110 may perform an interface function with respect to an external device such as a memory controller, and operate as a master chip MS that performs a signal distribution function of buffering a command, an address, a clock, and data and transmitting the buffered command, address, clock, and data to the first through fourth dies 110-140. The first die 110 may perform a read and/or write operation on a memory cell array in the core area in the first die 110 based on the command, address, clock, and data.

The second die 120 may perform a read and/or write operation on a memory cell array in the core area in the second die 120 based on the command, address, clock, and data received through the TSVs. The third and fourth dies 130 and 140 may also respectively perform a read and/or write operation on a memory cell array in the core areas in the third and fourth dies 130 and 140 based on the command, address, clock, and data received through the TSVs. The second through fourth dies 120-140 may operate as slave chips SLVs against the first die 110 which is the master chip MS.

The memory controller connected to the semiconductor device 100 may use a master/slave classification circuit to identify the first through fourth dies 110-140 of the semiconductor device 100. The memory controller may identify core areas of the first through fourth dies 110-140 based on a chip ID (CID). The first through fourth dies 110-140 may be identified as to whether an interface area thereof functions as a master chip or a slave chip by using a master/slave classification circuit of the first through fourth dies 110-140.

According to an exemplary implementation, the memory controller may identify, for example, the core area of the first die 110 as CID0, and the core areas of the second through fourth dies 120 through 140 sequentially as CID1, CID2, and CID3. The interface area of the first die 110 may be identified as a master chip, and the interface areas of the second, third, and fourth dies 120, 130, and 140 may be identified as slave chips.

Meanwhile, before the semiconductor device 100 is forwarded as a product, one of the first through fourth dies 110-140 may become defective. In this case, instead of treating the semiconductor device 100 as a defective product as a whole, if a chip ID of a die having a defect is blocked and new chip IDs are reassigned to normal, working dies, the yield of the semiconductor device may be increased and the manufacturing costs may be reduced. According to exemplary implementations, a semiconductor device including a chip ID generation circuit that selectively reassigns a chip ID to the first through fourth dies 110-140 of a multi-chip package is provided.

Figure 2:
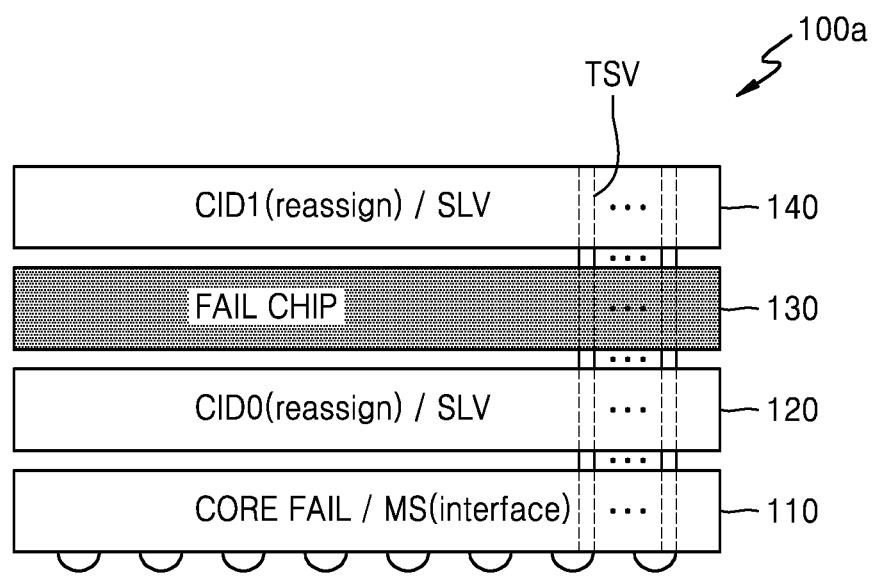
FIGS. 2 through 4 are diagrams for describing a semiconductor device in which a chip ID is selectively reassigned, according to exemplary implementations.
Figure 3:
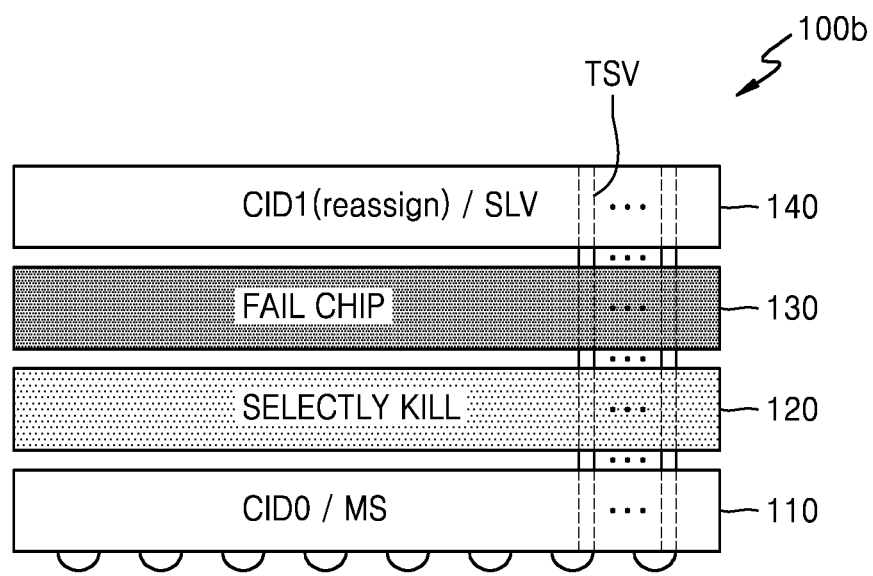
Figure 4:
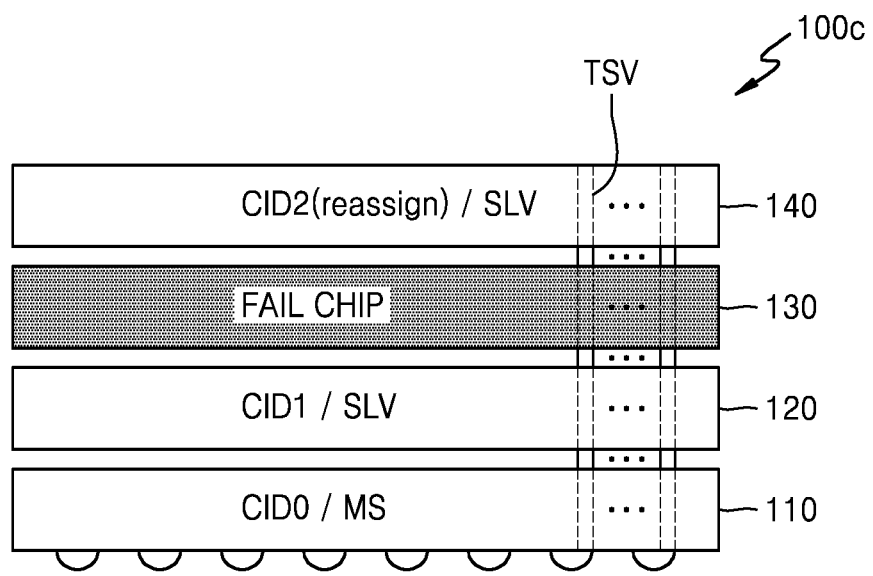

FIGS. 2 through 4 are diagrams for respectively describing semiconductor devices 100a, 100b, and 100c selectively reassigning a chip ID according to exemplary implementations.

As shown in FIG. 2, compared to the semiconductor device 100 of FIG. 1, when a core area of a first die 110 of the semiconductor device 100a is defective, and a third die 130 of the semiconductor device 100a is determined as a defective chip, a multi-chip package including only an interface area of the first die 110, a second die 120, and a fourth die 140 may be implemented. CID0 is reassigned as a chip ID of the second die 120, and CID1 may be reassigned as a chip ID of the fourth die 140. Output of chip IDs of the first die 110 and the third die 130 may be blocked. Even when the chip ID of the first die 110 is blocked, the interface area of the first die 110 that functions as an interface with respect to the memory controller may be activated. The first die 110 may operate as a master chip MS.

As shown in FIG. 3, compared to the semiconductor device 100 of FIG. 1, when it is chosen to stop use of a second die 120 of a semiconductor device 100b, and a third die 130 of the semiconductor device 100b is determined as a defective chip, a multi-chip package including only a first die 110 and a fourth die 140 may be implemented. Although the second die 120 is not a defective chip, the second die 120 may be chosen to stop its use considering product reliability of the semiconductor device 100b. The designation of chips as defective and/or as chips to not be used may be a result from testing of the chips. For example, after testing of the different chips, if a particular chip repeatedly fails to correctly store data, it may be designated as a failed chip. Or, if a particular chip consistently takes more than a desired amount of time to read or write data, it may be designated as a failed chip. A chip selectively killed may be a chip that has a frequency of errors and/or speed lower than a fail threshold, but still below a desired reliability and/or speed rating. The designation of chips as failed and/or as chips not to be used can me made automatically during the testing stage, or can be made with the interaction of a user. An "unused chip" when described herein refers to a chip that is either selectively killed or is a failed chip. A chip ID of the first die 110 is CID0 without change, and CID1 may be reassigned as a chip ID of the fourth die 140. Output of chip IDs of the second die 120 and the third die 130 may be blocked.

As shown in FIG. 4, compared to the semiconductor device 100 of FIG. 1, when a third die 130 of the semiconductor device 100c is determined as a defective chip, a multi-chip package including only a first die 110, a second die 120, and a fourth die 140 may be implemented. Chips IDs of the first and second dies 110 and 120 are respectively CID0 and CID1 without change, and CID2 may be reassigned as a chip ID of the fourth die 140. Output of a chip ID of the third die 130 may be blocked.

The method of reassigning a chip ID described with reference to FIGS. 2 through 4 may be performed, for example, using chip ID generation circuits illustrated in FIG. 5.

Figure 5:
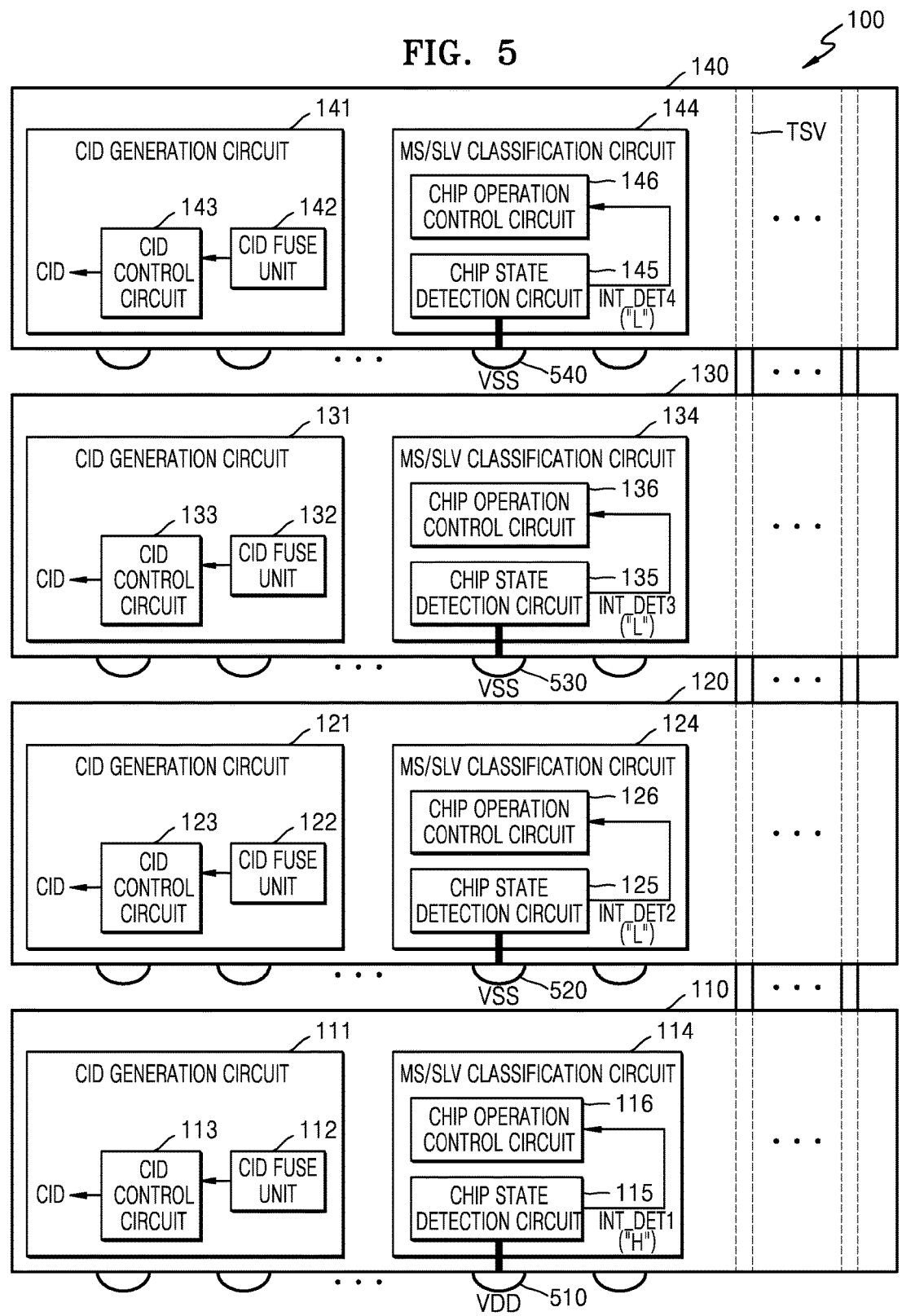
FIG. 5 is a diagram for describing a semiconductor device including a chip ID generation circuit according to an exemplary implementation.

FIG. 5 is a diagram for describing a semiconductor device 100 including chip ID generation circuits according to an exemplary implementation.

As shown in FIG. 5, in the semiconductor device 100, first through fourth dies 110-140 respectively include chip ID generation circuits 111, 121, 131, and 141 and master/slave classification circuits 114, 124, 134, and 144.

In the first die 110, the chip ID generation circuit 111 may include a chip ID fuse unit 112 and a chip ID control circuit 113 to modify a chip ID of the first die 110. The chip ID fuse unit 112, also referred to as a chip ID fuse circuit 112, may include a plurality of fuse sets, and may selectively program a chip ID to the plurality of fuse sets. The chip ID control circuit 113 may provide an output of a fuse set selected from among the plurality of fuse sets of the chip ID fuse unit 112 as a chip ID CID of the first die 110.

The chip ID generation circuit 111 may program a chip ID of the first die 110 as, for example, CID=0, to one of the plurality of fuse sets of the chip ID fuse unit 112, and may provide the chip ID of the first die 110 as CID=0 via the chip ID control circuit 113. According to the present exemplary implementation, CID=0 provided as the chip ID of the first die 110 may also apply to the exemplary implementations of FIGS. 1, 3, and 4.

In certain exemplary implementations, the master/slave classification circuit 114 of the first die 110 may control the first die 110 such that an interface area of the first die 110 operates as a master chip. For example, the master/slave classification circuit 114 of the first die 110 may control the first die 110 such that the first die 110 operates as a master chip regardless of the chip ID of the first die 110. The above-described controlling of the master/slave classification circuit 114 of the first die 110 may apply to the exemplary implementation of FIG. 2.

The master/slave classification circuit 114 may include a chip state detection circuit 115 and a chip operation control circuit 116. The chip state detection circuit 115 may be connected to an external connection terminal 510 of the first die 110 (e.g., a bump, solder ball, or other conductive terminal, which may be formed at an external surface of the first die 110), and may detect a bonding state of the external connection terminal 510 and output a first detection signal INT_DET1. A chip state of the first die 110 may be determined based on the first detection signal INT_DET1.

In certain exemplary implementations, when the external connection terminal 510 of the first die 110 is bonded to a signal wiring that is connected to, for example, a power voltage VDD, the external connection terminal 510 is set to logic high H. the chip state detection signal 115 outputs a first detection signal INT_DET1 which is logic high H, and recognize that the first die 110 is a master chip. The chip operation control circuit 116 may control the first die 110 to operate as a master chip in response to the first detection signal INT_DET1 which is logic high H.

In certain exemplary implementations, a plurality of external connection terminals of the die 110 may be used to receive a master/slave control signal, for example from a controller or tester external to the die 110. If during testing or operation, it is determined that the die 110 is to be the master chip, then a signal (e.g., a slave/master chip selection signal) may be sent through the plurality of external connection terminals, and may cause the chip state detection circuit 115 to output either a first (e.g., high) or second (e.g., low) value. For example, a first value of the slave/master chip selection signal may cause the chip state detection circuit 115 to output a first value that indicates the first die 110 to be the master chip. On the contrary, other values besides the first value of the slave/master chip selection signal may cause the chip state detection circuit 115 to output a second value that indicates the first die 110 to be a slave chip.

In the second die 120, the chip ID generation circuit 121 may include a chip ID fuse unit 122 and a chip ID control circuit 123 in order to modify a chip ID of the second die 120. The chip ID fuse unit 122 may include a plurality of fuse sets, and selectively program a chip ID to the plurality of fuse sets. The chip ID control circuit 123 may provide an output of a fuse set selected from among the plurality of fuse sets of the chip ID fuse unit 122 as a chip ID CID of the second die 120.

The chip ID generation circuit 121 may program a chip ID of the second die 120 as, for example, CID=1, to one of the plurality of fuse sets of the chip ID fuse unit 122, and may provide the chip ID of the second die 120 as CID=1 via the chip ID control circuit 123.

According to an exemplary implementation, CID=1 provided as the chip ID of the second die 120 may also apply to the exemplary implementations of FIGS. 1 and 4. According to another exemplary implementation, when the chip ID of the second die 120 is changed to CID=0 as illustrated in FIG. 2, the chip ID generation circuit 121 may program the chip ID of the second die 120 as CID=0 using another one of the plurality of fuse sets of the chip ID fuse unit 122, and may provide the chip ID of the second die 120 as CID=0 via the chip ID control circuit 123.

In certain exemplary implementations, the master/slave classification circuit 124 of the second die 120 may control the second die 120 to operate as a slave chip. For example, the master/slave classification circuit 124 of the second die 120 may control the second die 120 to operate as a slave chip regardless of the chip ID of the second die 120.

The master/slave classification circuit 124 may include a chip state detection circuit 125 and a chip operation control circuit 126. The chip state detection circuit 125 may be connected to an external terminal 520 of the second die 120 (e.g., a bump, solder ball, or other conductive terminal), and may detect a bonding state of the external connection terminal 520 and output a second detection signal INT_DET2. A chip state of the second die 120 may be determined based on the second detection signal INT_DET2.

In certain exemplary implementations, when the external connection terminal 520 of the second die 120 is bonded to a signal wiring that is connected to, for example, a ground voltage VSS, the external connection terminal 520 is set to logic low L. The chip state detection signal 125 outputs a second detection signal INT_DET2 which is logic low L, and recognize that the second die 120 is a slave chip. The chip operation control circuit 126 may control the second die 120 to operate as a slave chip in response to the second detection signal INT_DET2 which is logic low L.

In certain exemplary implementations, a plurality of external connection terminals of the die 120 may be used to receive a master/slave control signal, for example from a controller or tester external to the die 120. These external connection terminals may be connected to respective external connection terminals of the die 110 (e.g., through TSVs). If during testing or operation, it is determined that the die 120 is to be the master chip, then a signal (e.g., a slave/master chip selection signal) may be sent through the plurality of external connection terminals, and may cause the chip state detection circuit 125 to output either a first (e.g., high) or second (e.g., low) value. For example, a second value of the slave/master chip selection signal other than the first value may cause the chip state detection circuit 125 to output a first value that indicates the second die 120 to be the master chip. On the contrary, other values besides the second value of the slave/master chip selection signal may cause the chip state detection circuit 125 to output a second value that indicates the second die 120 to be a slave chip.

In the third die 130, the chip ID generation circuit 131 may include a chip ID fuse unit 132 and a chip ID control circuit 133 in order to modify a chip ID of the third die 130. The chip ID fuse unit 132 may include a plurality of fuse sets, and selectively program a chip ID to the plurality of fuse sets. The chip ID control circuit 133 may provide an output of a fuse set selected from among the plurality of fuse sets of the chip ID fuse unit 132 as a chip ID CID of the third die 130.

The chip ID generation circuit 131 may program a chip ID of the third die 130 as, for example, CID=2 to one of the plurality of fuse sets of the chip ID fuse unit 132, and may provide the chip ID of the third die 130 as CID=2 via the chip ID control circuit 133.

According to an exemplary implementation, CID=2 provided as the chip ID of the third die 130 may also apply to the exemplary implementation of FIG. 1. According to another exemplary implementation, when the third die 130 is determined as a defective chip as in the exemplary implementations of FIGS. 2 through 4, the chip ID generation circuit 131 may block providing of the chip ID of the third die 130 via the chip ID control circuit 133.

In certain exemplary implementations, the master/slave classification circuit 134 of the third die 130 may control the third die 130 to operate as a slave chip. For example, the master/slave classification chip 134 of the third die 130 may control the third die 130 such that the third die 130 operates as a slave chip regardless of the chip ID of the third die 130.

The master/slave classification circuit 134 may include a chip state detection circuit 135 and a chip operation control circuit 136. In certain exemplary implementations, the chip state detection circuit 135 may be connected to a external connection terminal 530 of the third die 130 (e.g., a bump, solder ball, or other conductive terminal), detect a bonding state of the external connection terminal 530, and output a third detection signal INT_DET3. A chip state of the third die 130 may be determined based on the third detection signal INT_DET3.

In certain exemplary implementations, when the external connection terminal 530 of the third die 130 is bonded to a signal wiring that is connected to, for example, a ground voltage VSS, the external connection terminal 530 is set to logic low L. The chip state detection circuit 135 outputs a third detection signal INT_DET3 which is logic low L, and recognize that the third die 130 is a slave chip. The chip operation control circuit 136 may control the third die 130 to operate as a slave chip in response to the third detection signal INT_DET3 which is logic low L.

In certain exemplary implementations, a plurality of external connection terminals of the die 130 may be used to receive a master/slave control signal, for example from a controller or tester external to the die 130. These external connection terminals may be connected to respective external connection terminals of the die 110 (e.g., through TSVs), as well as to die 120. If during testing or operation, it is determined that the die 130 is to be the master chip, then a signal (e.g., a slave/master chip selection signal) may be sent through the plurality of external connection terminals, and may cause the chip state detection circuit 135 to output either a first (e.g., high) or second (e.g., low) value. For example, a third value of the slave/master chip selection signal different from the first and second values may cause the chip state detection circuit 135 to output a first value that indicates the third die 130 to be the master chip. On the contrary, other values besides the third value of the slave/master chip selection signal may cause the chip state detection circuit 135 to output a second value that indicates the third die 130 to be a slave chip.

In the fourth die 140, the chip ID generation circuit 141 may include a chip ID fuse unit 142 and a chip ID control circuit 143 in order to modify a chip ID of the fourth die 140. The chip ID fuse unit 142 may include a plurality of fuse sets, and selectively program a chip ID to the plurality of fuse sets. The chip ID control circuit 143 may provide an output of a fuse set selected from among the plurality of fuse sets of the chip ID fuse unit 142 as a chip ID of the fourth die 140.

The chip ID generation circuit 141 may program a chip ID of the fourth die 140 as, for example, CID=3, to one of the plurality of fuse sets of the chip ID fuse unit 142, and may provide the chip ID of the fourth die 140 as CID=3 via the chip ID control circuit 143.

According to an exemplary implementation, CID=3 provided as the chip ID of the fourth die 140 may also apply to the exemplary implementation of FIG. 1 described above. According to another exemplary implementation, when the chip ID of the fourth die 140 is changed to CID=1 as in the exemplary implementations of FIGS. 2 and 3, the chip ID generation circuit 141 may program the chip ID of the fourth die 140 to another one of the plurality of fuse sets of the chip ID fuse unit 142, as, for example, CID=1, and may provide the chip ID of the fourth die 140 as CID=1 via the chip ID control circuit 143. According to another exemplary implementation, when the chip ID of the fourth die 140 is changed to CID=2 as in the exemplary implementation of FIG. 4, the chip ID generation circuit 141 may program the chip ID of the fourth die 140 to another one of the plurality of fuse sets of the chip ID fuse unit 142, as, for example, CID=2, and may provide the chip ID of the fourth die 140 as CID=2 via the chip ID control circuit 143.

In certain exemplary implementations, the master/slave classification circuit 144 of the fourth die 140 may control the fourth die 140 to operate as a slave chip. For example, the master/slave classification chip 144 of the fourth die 140 may control the fourth die 140 such that the fourth die 140 operates as a slave chip regardless of the chip ID of the fourth die 140.

The master/slave classification circuit 144 may include a chip state detection circuit 145 and a chip operation control circuit 146. In certain exemplary implementations, the chip state detection circuit 145 may be connected to a external connection terminal 540 of the fourth die 140 (e.g., a bump, solder ball, or other conductive terminal), detect a bonding state of the external connection terminal 540, and output a fourth detection signal INT_DET4. A chip state of the fourth die 140 may be determined based on the fourth detection signal INT_DET4.

In certain exemplary implementations, when the external connection terminal 540 of the fourth die 140 is bonded to a signal wiring that is connected to, for example, a ground voltage VSS, the external connection terminal 540 is set to logic low L. The chip state detection signal 145 outputs a fourth detection signal INT_DET4 which is logic low L, and recognize that the fourth die 140 is a slave chip. The chip operation control circuit 146 may control the fourth die 140 to operate as a slave chip in response to the fourth detection signal INT_DET4 which is logic low L.

In certain exemplary implementations, a plurality of external connection terminals of the die 140 may be used to receive a master/slave control signal, for example from a controller or tester external to the die 140. These external connection terminals may be connected to respective external connection terminals of the die 110 (e.g., through TSVs), as well as to dies 120 and 130. If during testing or operation, it is determined that the die 140 is to be the master chip, then a signal (e.g., a slave/master chip selection signal) may be sent through the plurality of external connection terminals, and may cause the chip state detection circuit 145 to output either a first (e.g., high) or second (e.g., low) value. For example, a fourth value of the slave/master chip selection signal different from the first, second, and third values may cause the chip state detection circuit 145 to output a first value that indicates the fourth die 140 to be the master chip. On the contrary, other values besides the fourth value of the slave/master chip selection signal may cause the chip state detection circuit 145 to output a second value that indicates the fourth die 140 to be a slave chip.

As described above with reference to FIGS. 1 through 4, as an operation of reassigning chip IDs such as CID=1, CID=2, CID=3 may be required with respect to the fourth die 140, an operation of the chip ID generation circuit 141 of the fourth die 140 is described with reference to FIG. 6 below as a representative example of the chip ID generation circuits 111, 121, 131, and 141. Description of the operation of the chip ID generation circuit 141 of the fourth die 140 may also apply to the other chip ID generation circuits 111, 121, and 131.

Figure 6:
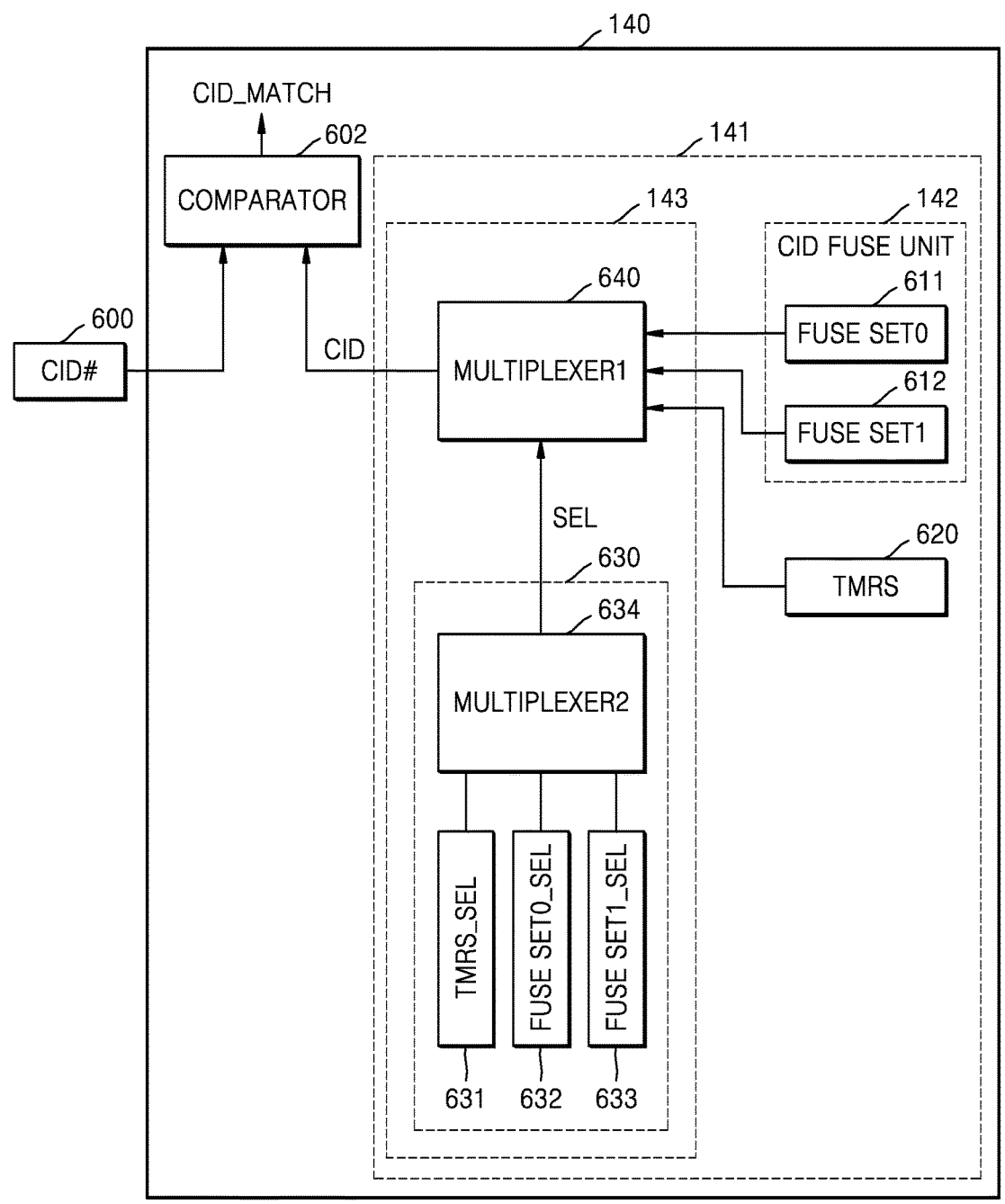
FIGS. 6 and 7 are diagrams for describing the chip ID generation circuit of FIG. 5.
Figure 7:
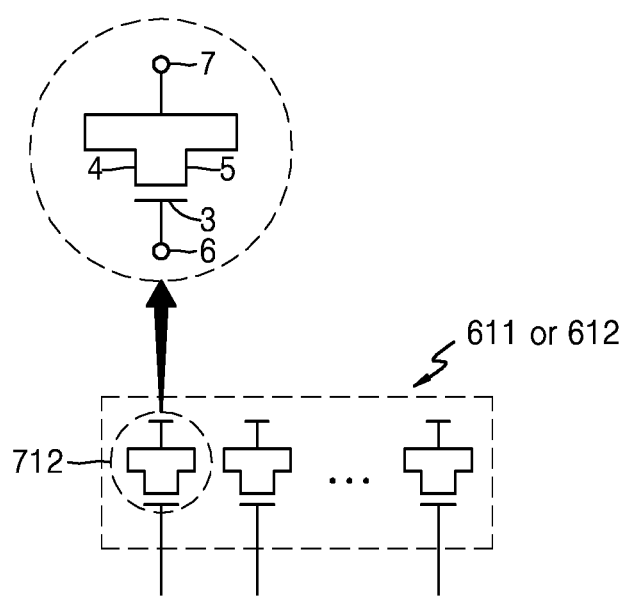

FIGS. 6 and 7 are diagrams for describing the chip ID generation circuit 141 of FIG. 5. FIG. 6 is a block diagram illustrating the chip ID generation circuit 141, and FIG. 7 is a circuit diagram illustrating fuse sets in the chip ID generation circuit 141.

As shown in FIG. 6, the chip ID generation circuit 141 may include the chip ID fuse unit 142 and the chip ID control circuit 143. The chip ID fuse unit 142 may include first and second fuse sets 611 and 612. According to an exemplary implementation, the chip ID fuse unit 142 may include various numbers of fuse sets.

The first and second fuse sets 611 and 612 may each be configured as an anti-fuse array including anti-fuses 712 as illustrated in FIG. 7. The anti-fuse 712 has opposite electrical characteristics to those of a fuse element. That is, the anti-fuse 712 is a resistive fuse element having a relatively high resistance value in a non-programmed state and a relatively low resistance value in a programmed state.

The anti-fuse 712 typically includes conductors and a dielectric body inserted between the conductors. The anti-fuse 712 is programmed by destroying the dielectric body between two conductors by applying a high voltage via the conductors of the anti-fuse 712 at two ends thereof. As a result of programming, the conductors of the anti-fuse 712 at the two ends thereof may be shorted so that the anti-fuse 712 may have a low resistance value.

The anti-fuse 712 may be a depletion-type metal oxide semiconductor (MOS) transistor in which a source 4 and a drain 5 are connected to each other. In an initial state, a resistance between a first node 6 connected to a gate electrode 3 and a second node 7 that is commonly connected to the source 4 and the drain 5 is relatively high as the first node 6 and the second node 7 are separated from each other via a gate oxide layer. Accordingly, no electricity flows between the first node 6 and the second node 7. For example, this state where no electricity flows may be set to logic 'low' which is a non-programmed state.

The anti-fuse 712 may be irreversibly turned from a non-conductive state to an electrically conductive state by destroying the gate oxide layer by applying a breakdown voltage between the first node 6 and the second node 7. When the gate oxide layer is destroyed, a resistance between the first node 6 and the second node 7 is reduced. This state may be set as a logic 'high' which is a programmed state.

According to certain exemplary implementations, the various fuse sets on different dies described herein may be programmed according to a control signal, for example, sent from a controller or tester external to the semiconductor device 100. For example, the fuse sets may be programmed during a testing phase of the semiconductor device 100.

As shown in FIG. 6, in the first and second fuse sets 611 and 612, particular anti-fuses 712 may be selectively programmed to store the chip ID of the fourth die 140 (see FIG. 1). The first fuse set 611 may be programmed as CID=3 which is an initial, default chip ID of the fourth die 140. The second fuse set 612 may be programmed as CID=1 which is the chip ID of the fourth die 140 of FIG. 3. Alternatively, the second fuse set 612 may be programmed as CID=2 which is the chip ID of the fourth die 140 of FIG. 4.

The chip ID generation circuit 141 may determine a chip ID of the fourth die 140 by being linked to a mode register TMRS 620 that supports a test mode. The mode register TMRS 620 may be used in an operation of testing a chip ID of the fourth die 140 before programming a chip ID to the first and second fuse sets 611 and 612 of the chip ID fuse unit 142. The operation of testing a chip ID of the fourth die 140 may be performed before reassigning a chip ID to one of the first and second fuse sets 611 and 612 in the chip ID fuse unit 142, or also after reassigning a chip ID. The chip ID that is tested and determined by using the mode register TMRS 620 may be programmed to the first and second fuse sets 611 and 612.

The chip ID control circuit 143 may include a selection signal generating unit 630 and a first multiplexer 640. The selection signal generating unit 630 may generate a selection signal SEL used to select one of chip IDs provided by the first and second fuse sets 611 and 612 and the mode register TMRS 620.

The selection signal generation circuit 630 may include first through third signal providers 631 through 633 and a second multiplexer 634. The first signal provider 631 may provide a first signal TMRS_SEL used to select a chip ID provided by the mode register TMRS 620, and the second signal provider 632 may provide a second signal FUSE SET0_SEL used to select a chip ID provided by the first fuse set 611, and the third signal provider 633 may provide a third signal FUSE SET1_SEL used to select a chip ID provided by the second fuse set 612.

According to an exemplary implementation, the first through third signal providers 631 through 633 may be implemented by the anti-fuses 712 of FIG. 7. According to an embodiment, when the chip ID fuse unit 142 includes a plurality of fuse sets, the chip selection generation circuit 630 may include a plurality of signal providers respectively corresponding to the plurality of fuse sets and for selecting a chip ID provided by each fuse set.

The second multiplexer 634 may select one of the first through third signals TMRS_SEL, FUSE SET0_SEL, and FUSE SET1_SEL of the first through third signal providers 631 through 633 and output the selected signal as a selection signal SEL. The selection signal SEL of the second multiplexer 634 may be provided to the first multiplexer 640.

The first multiplexer 640 may select one of chip IDs provided by the first and second fuse sets 611 and 612 of the chip fuse unit 142 and the mode register TMRS 620 in response to the selection signal SEL. A chip ID selected by using the first and second fuse sets 611 and 612 and the mode register TMRS 620 may be output as a chip ID CID of the fourth die 140. By including two different fuse sets, 611 and 612, as well as TMRS 620, in combination with selectors 631, 632, and 633, the chip ID of a single die can be changed more than once (e.g., by including two options for a chip ID in the two respective fuse sets), and can be selectively controlled to have different values, either during testing or during operation of the semiconductor device 10. According to an exemplary implementation, when the fourth die 140 is determined as a defective chip, the first multiplexer 640 may block providing of the chip ID of the fourth die 140.

The chip ID CID of the fourth die 140 output from the first multiplexer 640 may be compared with a chip ID CID# issued by using a controller 600. A comparator 602 may compare the chip ID CID# issued by using the controller 600 with the chip ID CID of the fourth die 140 to generate a chip ID match signal CID_MATCH. The comparator 602 may be included in the fourth die 140. The chip match signal CID_MATCH may be activated when the chip ID CID# issued by using the controller 600 corresponds to the chip ID CID of the fourth die 140, and the fourth die 140 may operate in response to the chip ID CID# of the controller 600. According to an exemplary implementation, the comparator 602 may be included in the chip ID generation circuit 141.

Figure 8:
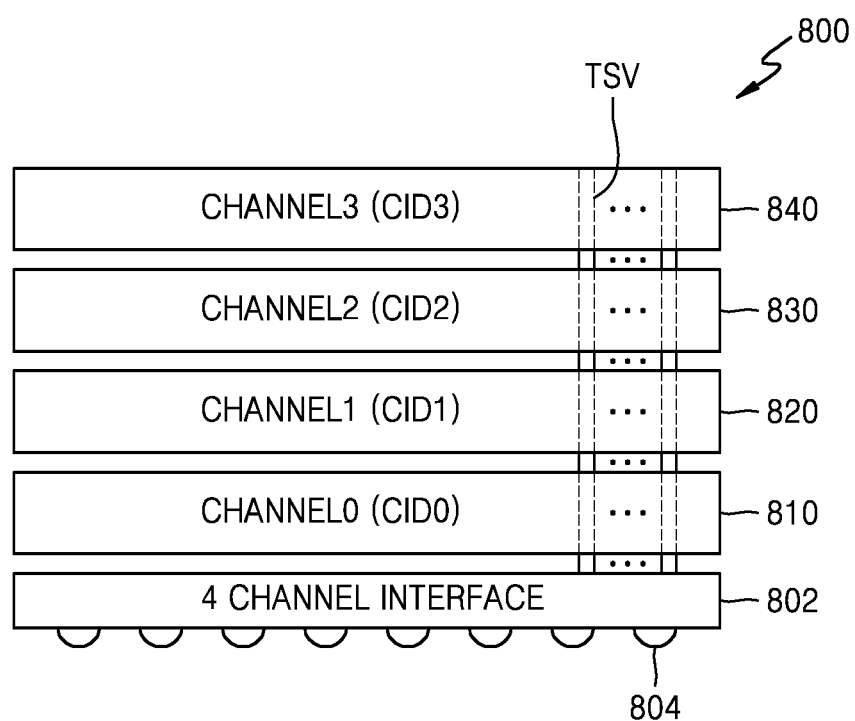
FIGS. 8 through 11 are diagrams for describing a multi-chip package according to exemplary implementations.
Figure 9:
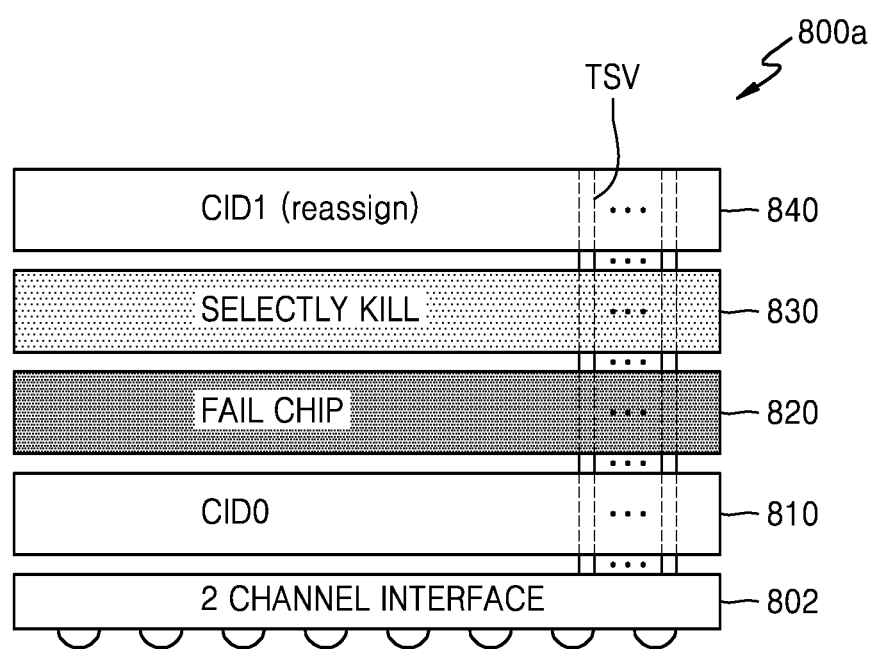
Figure 10:
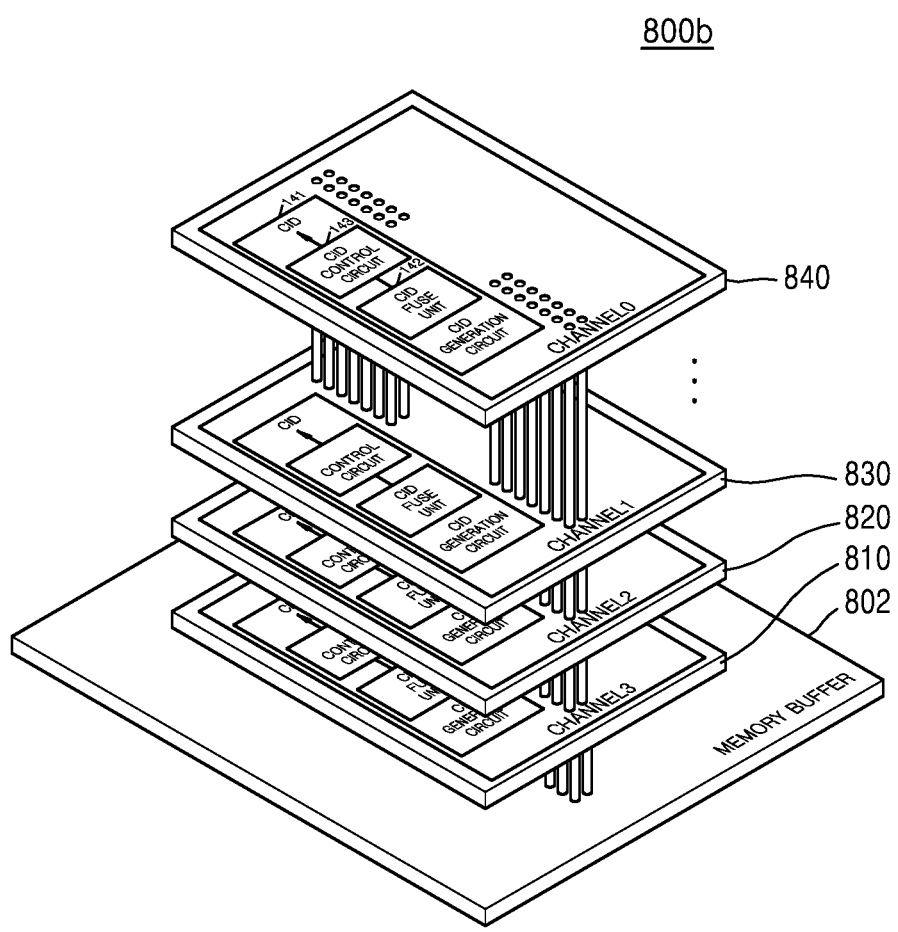
Figure 11:
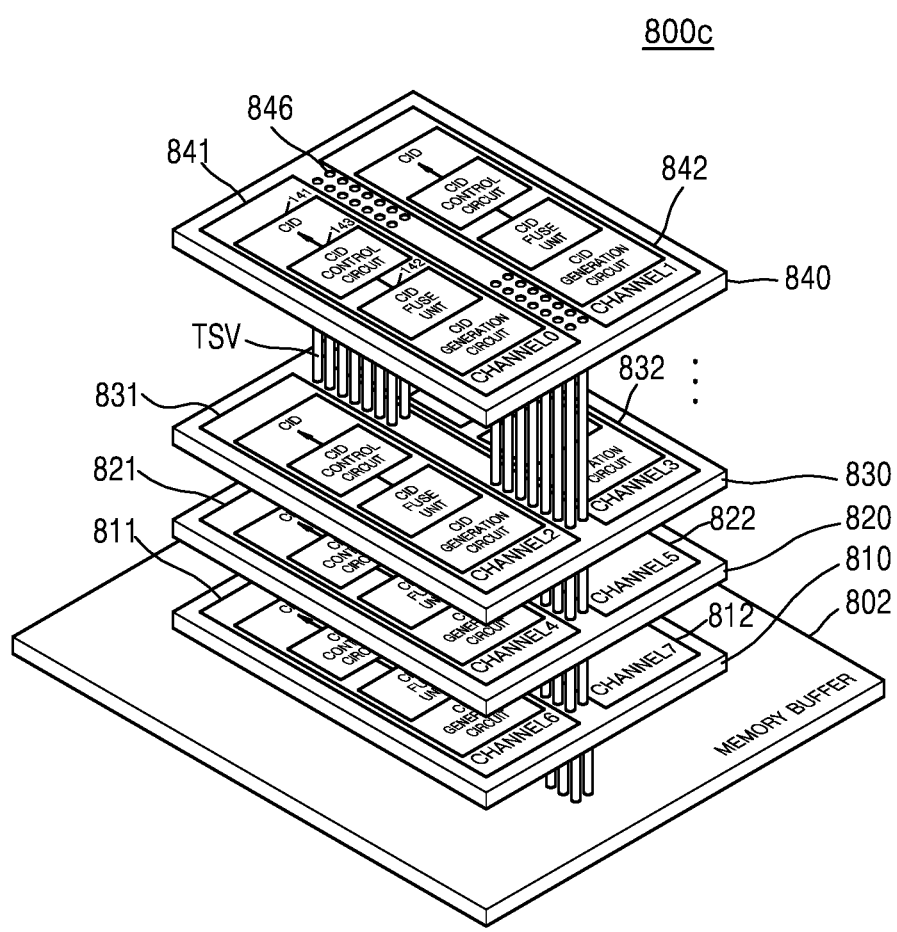

FIGS. 8 through 11 are diagrams for describing a multi-chip package according to embodiments of the inventive concept. FIG. 8 illustrates a 4-channel interface multi-chip package 800, and FIG. 9 illustrates a 2-channel interface multi-chip package 800a. FIGS. 10 and 11 respectively illustrate a 4-channel multi-chip package 800b and an 8-channel multi-chip package 800c.

As shown in FIG. 8, the multi-chip package 800 may include a memory buffer 802 below memory layers 810, 820, 830, and 840 that are stacked. The memory buffer 802 may receive a command, an address, a clock, and data from a memory controller (not shown), and perform a signal distribution function of providing the command, address, clock, and data to the memory layers 810, 820, 830, and 840. The memory buffer 802 buffers all of the command, address, clock, and data, and thus, the memory controller may interface with the memory layers 810, 820, 830, and 840 through memory buffer 802.

The memory buffer 802 and the memory layers 810, 820, 830, and 840 may transmit and receive a signal to and from each other via through substrate vias TSVs. The memory buffer 802 may communicate with an external memory controller by using a conductive unit formed on an external surface of the multi-chip package 800 such as via solder balls 804.

The memory layers 810, 820, 830, and 840 may each constitute a plurality of independent interfaces which are called first through fourth channels. Each of the first through fourth channels of the memory layers 810, 820, 830, and 840 may include independent memory banks, and are independently clocked. A chip ID of the first channel 810 is identified as CID=0, and a chip ID of the second channel 820 may be identified as CID=1. Chip IDs of the third and fourth channels 830 and 840 may be respectively identified as CID=2 and CID=3. The memory buffer 802 may set the multi-chip package 800 to operate as a 4-channel interface including the first through fourth channels 810 through 840.

In the memory device 800a of FIG. 9, when a memory layer of the second channel 820 is determined as a defective chip, and it is chosen to stop use of a memory layer of the third layer 830, the memory buffer 802 may be set to operate as a 2-channel interface including only the first channel 810 and the fourth channel 840. A chip ID of the first channel 810 is CID0 without change, and CID1 may be reassigned as a chip ID of the fourth channel 840. Chip IDs of the second channel 820 and the third channel 830 may be blocked.

In the multi-chip package 800b of FIG. 10, four memory layers 810, 820, 830, and 840 are stacked as four channels. Each of the memory layers 810 through 840 may include the chip ID generation circuit 141 of FIG. 6 described above. The chip ID generation circuit 141 may include the chip ID fuse unit 142 including at least two fuse sets that selectively program a chip ID of each of the channels 810 through 840 and the chip ID control circuit 143 that outputs an output of a fuse set selected from the at least two fuse sets as a chip ID of a channel.

The chip ID generation circuit 141 may be connected to the mode register TMRS 620 (see FIG. 6) to test and determine a chip ID of the memory layers 810-840. A chip ID of the memory layers 810-840 that is tested and determined by using the mode register 620 may be programmed to a fuse set selected from among the at least two fuse sets in the chip ID fuse unit 142. When a channel from among the channels of the memory layers 810 through 840 is determined as defective or is selected to stop its use, the chip ID generation circuit 141 may block output of a chip ID of the determined channel.

An example in which four memory layers 810, 820, 830, and 840 are stacked to constitute eight channels is described with reference to FIG. 11. In the multi-chip package 800c of FIG. 11, the memory layers 810, 820, 830, and 840 may each include two channels 811 and 812, 821 and 822, 831 and 832, and 841 and 842.

The eight channels, that is, the channels 811 and 812, 821 and 822, 831 and 832, and 841 and 842 may each include the chip ID generation circuit 141 of FIG. 6 described above. The chip ID generation circuit 141 may include the chip ID fuse unit 142 including at least two fuse sets that selectively program a chip ID of each of the channels 811 and 812, 821 and 822, 831 and 832, and 841 and 842 and the chip ID control circuit 143 that outputs an output of a fuse set selected from among the at least two fuse sets as a chip ID of a channel.

The chip ID generation circuit 141 may be connected to the mode register TMRS 620 (see FIG. 6) to test and determine a chip ID of the channels 810-840. A chip ID of the channels 811 and 812, 821 and 822, 831 and 832, and 841 and 842 that is tested and determined by using the mode register TMRS 620 may be programmed to a fuse set selected from among the at least two fuse sets in the chip ID fuse unit 142. When a channel from among the channels 811 and 812, 821 and 822, 831 and 832, and 841 and 842 is determined as defective or is selected to stop its use, the chip ID generation circuit 141 may block output of a chip ID of the corresponding channel.

Figure 12:
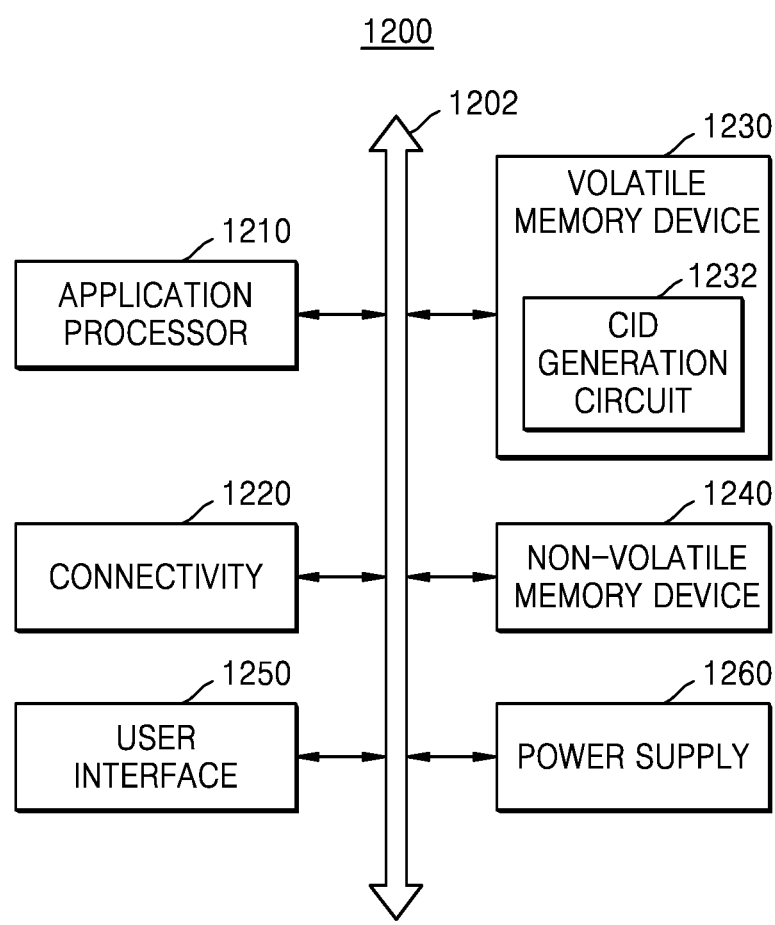
FIG. 12 is a block diagram illustrating a mobile system, to which a memory device including a chip ID generation circuit according to exemplary implementations is applied.

FIG. 12 is a block diagram illustrating a mobile system 1200 which includes a memory device having a chip ID generation circuit according to exemplary implementations.

As shown in FIG. 12, the mobile system 1200 may include an application processor 1210, a connectivity unit 1220, a first memory device 1230, a second memory device 1240, a user interface 1250, and a power supply 1260 which are connected to one another via a bus 1202. The first memory device 1230 may be a volatile memory device, and the second memory device 1240 may be a non-volatile memory device.

According to an exemplary implementation, the mobile system 1200 may be a mobile system such as a mobile phone, a smart phone, a personal digital assistant (PDA), a portable multimedia player (PMP), a digital camera, a music player, a portable game console, or a navigation system.

The application processor 1210 may execute applications providing an Internet browser, games or moving images. According to an exemplary implementation, the application processor 1210 may include a single core processor or a multi-core processor. For example, the application processor 1210 may include a dual-core processor, a quad-core processor, or a hexa-core processor. Also, according to an exemplary implementation, the application processor 1210 may further include a cache memory inside or outside the application processor 1210.

The connectivity unit 1220 may perform wired or wireless communication with an external device. For example, the connectivity unit 1220 may perform Ethernet communication, near field communication (NFC), radio frequency identification (RFID) communication, mobile telecommunication, memory card communication, or universal serial bus (USB) communication. For example, the connectivity unit 1220 may include a baseband chipset and support communications such as Global System for Mobile Communication (GSM), General Packet Radio Service (GRPS), Wideband Code Division Multiple Access (WCDMA), or High Speed Packet Access (HSPA).

The first memory device 1230 which is a volatile memory device may store data processed by using the application processor 1210 as write data, or may operate as a working memory. The first memory device 1230 may be formed of a multi-chip package including a plurality of memory chips, and may include a chip ID generation circuit 1232 that selectively modifies chip IDs of memory chips. The chip ID generation circuit 1232 may include at least two fuse sets that selectively program a chip ID of a memory chip, and may output an output of a fuse set selected from among the at least two fuse sets as the chip ID of the memory chip. When the memory chip is determined as a defective chip or selected to stop its use, the chip ID generation circuit 1232 may block output of the chip ID of the memory chip.

The second memory device 1240 which is a non-volatile memory device may store a boot image to boot the mobile system 1200. For example, the second memory device 1240 may be an Electrically Erasable Programmable Read-Only Memory (EEPROM), a Flash Memory, a Phase Change Random Access Memory (PRAM), a Resistance Random Access Memory (RRAM), a Nano Floating Gate Memory (NFGM), a Polymer Random Access Memory (PoRAM), a Magnetic Random Access Memory (MRAM), a Ferroelectric Random Access Memory (FRAM) or a similar memory thereto.

The user interface 1250 may include at least one input device such as a keypad or a touch screen and/or at least one output device a speaker or a display device. The power supply 1260 may supply operating voltages of the mobile system 1200. Also, according to an embodiment, the mobile system 1200 may further include a camera image processor (CIP), and also may further include a storage device such as a memory card, a solid state driver (SSD), a hard disk drive (HDD), or a CD-ROM.

Figure 13:
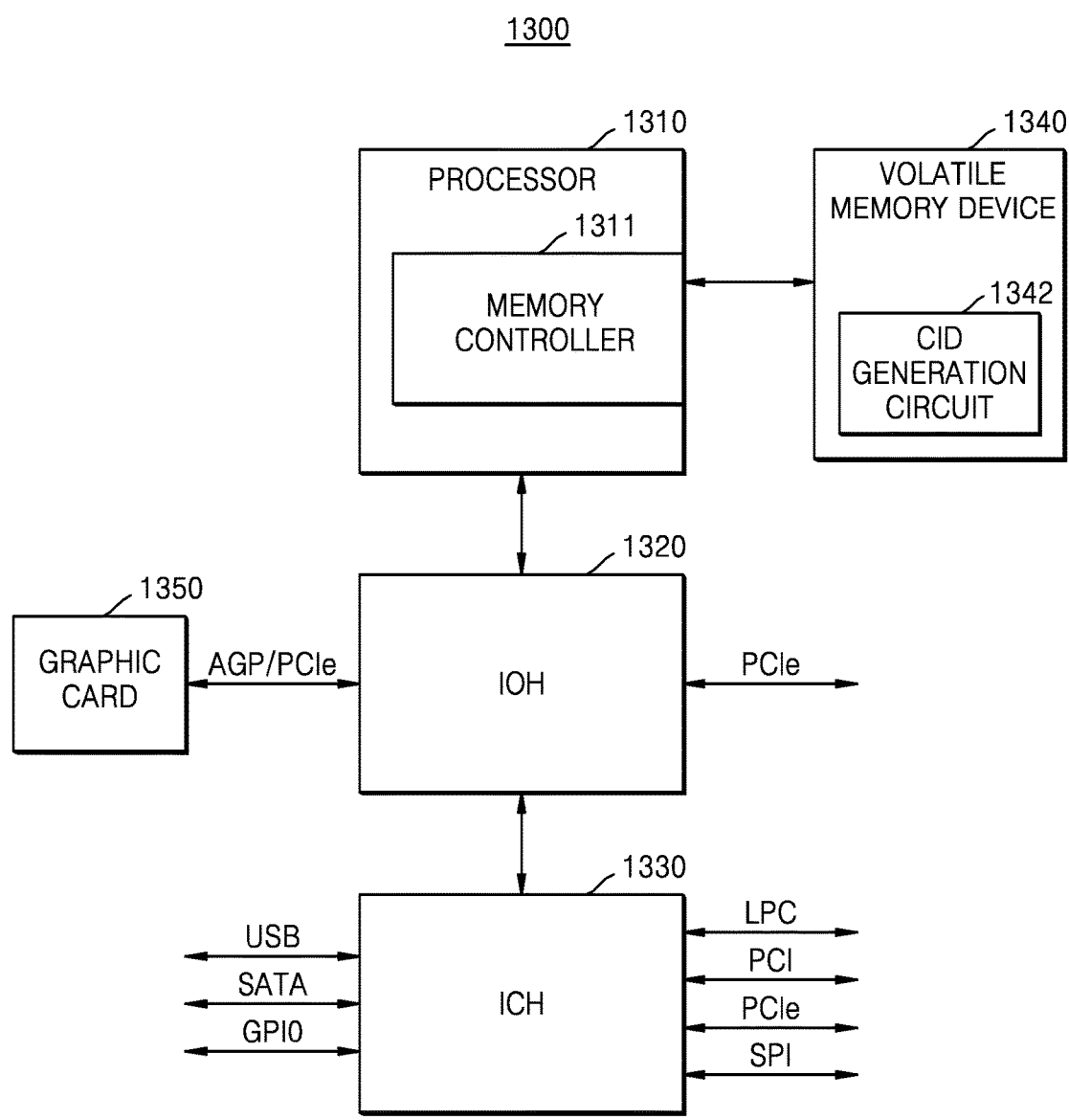
FIG. 13 is a block diagram illustrating a computing system, to which a memory device including a chip ID generation circuit according to exemplary implementations is applied.

FIG. 13 is a block diagram illustrating a computing system 1300 which includes a memory device having a chip ID generation circuit according to exemplary implementations.

The computing system 1300 may include a processor 1310, an input/output hub 1320, an input/output controller hub 1330, a memory device 1340, and a graphic card 1350. According to an exemplary implementation, the computing system 1300 may be a computing system such as a personal computer (PC), a server computer, a workstation, a laptop computer, a mobile phone, a smart phone, a PDA, a PMP, a digital camera, a digital television, a set-top box, a music player, a portable game console, or a navigation system.

The processor 1310 may execute various computing functions such as predetermined calculations or tasks. For example, the processor 1310 may be a microprocessor or a central processing unit (CPU). According to an embodiment, the processor 1310 may include a single core processor or a multi-core processor. For example, the processor 1310 may include a dual-core processor, a quad-core processor, or a hexa-core processor. While the computing system 1300 including one processor 1310 is illustrated in FIG. 13, the computing system 1300 may also include a plurality of processors according to an embodiment. Also, according to an embodiment, the processor 1310 may further include a cache memory inside or outside the processor 1310.

The processor 1310 may include a memory controller 1311 controlling an operation of the memory device 1340. The memory controller 1311 included in the processor 1310 may be referred to as an integrated memory controller (IMC). According to an embodiment, the memory controller 1311 may be located in the input/output hub 1320. The input/output hub 1320 including the memory controller 1311 may be referred to as a memory controller hub (MCH).

The memory device 1340 may be implemented as a multi-chip package including a plurality of memory chips, and include a chip ID generation circuit 1342 that selectively modifies chip IDs of the memory chips. The chip ID generation circuit 1342 may include at least two fuse sets that selectively program a chip ID of a memory chip, and may output an output of a fuse set selected from among the at least two fuse sets as the chip ID of the memory chip. When the memory chip is determined as a defective chip or is selected to stop its use, the chip ID generation circuit 1342 may block an output of the chip ID of the memory chip.

The input/output hub 1320 may control data transmission between devices such as the graphic card 1350, and the processor 1310. The input/output hub 1320 may be connected to the processor 1310 via various types of interfaces. For example, the input/output hub 1320 and the processor 1310 may be connected via interfaces of various standards such as a front side bus (FSB), a system bus, a HyperTransport, a Lighting Data Transport (LDT), a QuickPath Interconnect (QPI), a common system interface, a Peripheral Component Interconnect-Express (PCIe), or a Common System Interface (CSI). While the computing system 1300 including one input/output hub 1320 is illustrated in FIG. 13, according to an exemplary implementation, the computing system 1300 may include a plurality of input/output hubs.

The input/output hub 1320 may provide various interfaces with respect to devices. For example, the input/output hub 1320 may provide an Accelerated Graphics Port (AGP) interface, a PCIe, or a Communications Streaming Architecture (CSA) interface.

The graphic card 1350 may be connected to the input/output hub 1320 via an AGP or a PCIe. The graphic card 1350 may control a display device (not shown) for displaying an image. The graphic card 1350 may include an internal processor for processing image data and an internal semiconductor memory device. According to an exemplary implementation, the input/output hub 1320 may include a graphic device therein, in addition to or instead of the graphic card 1350 located outside the input/output hub 1320. The graphic device included in the input/output hub 1320 may be referred to as integrated graphics. Also, the input/output hub 1320 including the memory controller and the graphic device may be referred to as a Graphics and Memory Controller Hub (GMCH).

The input/output controller hub 1330 may perform data buffering and interface arbitration so that various system interfaces may operate efficiently. The input/output controller hub 1330 may be connected to the input/output hub 1320 via an internal bus. For example, the input/output hub 1320 and the input/output controller hub 1330 may be connected to each other via a Direct Media Interface (DMI), a hub interface, an Enterprise Southbridge interface (ESI), or a PCIe.

The input/output controller hub 1330 may provide various interfaces with respect to peripheral devices. For example, the input/output controller hub 1330 may provide a Universal Serial Bus (USB) port, a Serial Advanced Technology Attachment (SATA) port, a General Purpose Input/output (GPIO), a Low Pin Count (LPC) bus, a Serial Peripheral Interface (SPI), a PCI, or a PCIe.

According to an exemplary implementation, at least two of the processor 1310, the input/output hub 1320 or the input/output controller hub 1330 may be implemented as a chipset.

While the inventive concept has been particularly shown and described with reference to exemplary implementations thereof, it will be understood that various changes in form and details may be made therein without departing from the spirit and scope of the following claims.

What is claimed is:

1. A semiconductor device comprising a plurality of chips, wherein each chip of the plurality of chips comprises:
   a core area including a memory cell array;
   an interface area configured to provide an external interface;
   a chip ID generation circuit configured to selectively modify a chip ID of the corresponding chip by programming the chip ID in storage of the corresponding chip; and
   a master/slave classification circuit configured to identify whether the interface area of the corresponding chip corresponds to a master chip or a slave chip,
   wherein the chip ID is effective to identify at least one of a core area of the corresponding chip, a channel of the corresponding chip, and the corresponding chip.

2. The semiconductor device of claim 1,
   wherein the storage comprises a chip ID fuse unit comprising at least two fuse sets that are each configured to be programmed with the chip ID; and
   wherein the chip ID generation circuit comprises a chip ID control circuit configured to output an output of a fuse set selected from among the at least two fuse sets, as the chip ID.

3. The semiconductor device of claim 2, wherein the at least two fuse sets comprise an anti-fuse array including anti-fuses.

4. The semiconductor device of claim 2,
   wherein the chip ID generation circuit is connected to a mode register that is configured to support a test mode of the semiconductor device, and wherein the chip ID generation circuit is configured to determine the chip ID by testing the chip ID.

5. The semiconductor device of claim 4, wherein the chip ID generation circuit programs the chip ID determined by using the mode register to program one of the at least two fuse sets.

6. The semiconductor device of claim 1, wherein when the chip is determined as a defective chip, the chip ID generation circuit is configured to block an output of the chip ID.

7. The semiconductor device of claim 1, wherein when the chip is selected to stop its use, the chip ID generation circuit is configured to block an output of the chip ID.

8. The semiconductor device of claim 1, wherein the master/slave classification circuit comprises:
a chip state detection circuit connected to an external conductive terminal of the chip and configured to detect a bonding state of the external conductive terminal and output a detection signal; and
a chip operation control circuit configured to control the chip to operate as the master chip or the slave chip in response to the detection signal.

9. The semiconductor device of claim 8, wherein the external conductive terminal of the chip is connected to a power voltage or a ground voltage by bonding.

10. The semiconductor device of claim 1,
wherein the semiconductor device is a multi-chip package in which the plurality of chips are stacked, and
wherein the plurality of chips are electrically connected to one another via through electrodes.

11. A multi-chip package comprising:
a plurality of memory chips; and
a memory buffer configured to perform an external interface function of the multi-chip package and perform a signal distribution function with respect to the plurality of memory chips,
wherein the memory chips comprise channels that are stacked on the memory buffer, are electrically connected to one another via through electrodes, and provide interfaces that are independent of the memory buffer, and
wherein each of the memory chips comprises a chip ID generation circuit configured to selectively modify a chip ID of a corresponding channel.

12. The multi-chip package of claim 11, wherein the chip ID generation circuit comprises:
a chip ID fuse unit comprising at least two fuse sets that are configured to selectively program the chip ID of the corresponding channel; and
a chip ID control circuit configured to output an output of a fuse set selected from among the at least two fuse sets, as the chip ID of the corresponding channel.

13. The multi-chip package of claim 12,
wherein the chip ID generation circuit is connected to a mode register that is configured to support a test mode of the multi-chip package, and
wherein the chip ID generation circuit is configured to determine the chip ID of the corresponding channel by testing the chip ID of the corresponding channel using the mode register.

14. The multi-chip package of claim 13, wherein the chip ID generation circuit is configured to program the chip ID of the corresponding channel determined using the mode register to program one of the at least two fuse sets.

15. The multi-chip package of claim 11, wherein when the corresponding channel is determined as defective or is selected to stop its use, the chip ID generation circuit is configured to block an output of the chip ID of the corresponding channel.

16. A semiconductor device comprising a plurality of chips, each one comprising:
a chip ID generation circuit which includes a chip control circuit and a chip fuse unit which includes a plurality of fuse sets;
a master/slave classification circuit which includes a chip operation control circuit and a chip state detection circuit;
a core area including a memory cell array; and
an interface area including connection terminals for connection to an external device,
wherein adjacent chips are connected to one another via through electrodes,
wherein the chip ID generation circuit is configured to selectively generate a chip ID by selecting one of the plurality of fuse sets, and
wherein the master/slave classification circuit is configured to determine whether its respective chip operates as a master or slave chip in response to the external device connection through the interface area.

17. The semiconductor device of claim 16, wherein the plurality of fuse sets comprises an anti-fuse array including anti-fuses.

18. The semiconductor device of claim 16, wherein when the respective chip is determined to be a defective chip, the chip ID generation circuit is configured to block an output of the chip ID of the respective chip.

19. The semiconductor device of claim 16, wherein when the respective chip is selected to stop its use, the chip ID generation circuit is configured to block an output of the chip ID of the respective chip.

20. The semiconductor device of claim 16, wherein the chip ID generation circuit is connected to a mode register that is configured to support a test mode of the semiconductor device, and
wherein the chip ID generation circuit is configured to determine the chip ID of the respective chip by testing the chip ID of the respective chip.

* * * * *